US011171285B1

(12) United States Patent
Lai et al.

(10) Patent No.: US 11,171,285 B1
(45) Date of Patent: Nov. 9, 2021

(54) NON-FERROMAGNETIC SPACING COMPOSITE LAYER, ITS METHOD, SYNTHETIC ANTIFERROMAGNETIC LAMINATED STRUCTURE, AND MAGNETORESISTIVE RANDOM ACCESS MEMORY

(71) Applicant: SOLAR APPLIED MATERIALS TECHNOLOGY CORP., Tainan (TW)

(72) Inventors: Chih-Huang Lai, Tainan (TW);
Chun-Liang Yang, Tainan (TW);
Yi-Huan Chung, Tainan (TW);
Wei-Chih Huang, Tainan (TW);
Chih-Wen Tang, Tainan (TW);
Hui-Wen Cheng, Tainan (TW)

(73) Assignee: SOLAR APPLIED MATERIALS TECHNOLOGY CORP., Tainan (TW)

( * ) Notice: Subject to any disclaimer, the term of this patent is extended or adjusted under 35 U.S.C. 154(b) by 0 days.

(21) Appl. No.: 17/111,939

(22) Filed: Dec. 4, 2020

(30) Foreign Application Priority Data

Sep. 7, 2020 (TW) .................................. 109130662

(51) Int. Cl.
*H01L 43/02* (2006.01)
*H01L 43/12* (2006.01)
*H01L 43/10* (2006.01)
*H01L 27/22* (2006.01)
*G11C 11/16* (2006.01)

(52) U.S. Cl.
CPC .............. *H01L 43/02* (2013.01); *G11C 11/16* (2013.01); *H01L 27/222* (2013.01); *H01L 43/10* (2013.01); *H01L 43/12* (2013.01)

(58) Field of Classification Search
CPC ....... H01L 43/02; H01L 27/222; H01L 43/10; H01L 43/12; G11C 11/16
USPC ......................................................... 257/421
See application file for complete search history.

(56) References Cited

U.S. PATENT DOCUMENTS

| 2014/0038309 | A1* | 2/2014 | Abraham | ................ H01L 43/12 438/3 |
| 2016/0163965 | A1* | 6/2016 | Han | ........................ G01K 7/36 257/467 |
| 2018/0261269 | A1* | 9/2018 | Wilson | .................... H01L 43/02 |

FOREIGN PATENT DOCUMENTS

| TW | I557758 B | 11/2016 | |
| WO | WO-2017131584 A1 * | 8/2017 | ............. H01L 43/08 |

* cited by examiner

*Primary Examiner* — Jami Valentine Miller
(74) *Attorney, Agent, or Firm* — Muncy, Geissler, Olds & Lowe, P.C.

(57) ABSTRACT

Provided is a non-ferromagnetic spacing composite layer, comprising first, second and third spacing layers stacked in sequence. The first and third spacing layers are each made of Re, Rh, Ir, W, Mo, Ta, or Nb, and the second spacing layer is made of Ru. The second spacing layer has a thickness of equal to or more than 0.18 nm, and the non-ferromagnetic spacing composite layer has a total thickness of 0.6 nm to 1 nm. Also, provided are a method of preparing the non-ferromagnetic spacing composite layer, a synthetic antiferromagnetic laminated structure, and an MRAM. The synthetic antiferromagnetic laminated structure can maintain a certain coupling strength and the RKKY indirect interaction after thermal treatment, thereby keeping the recording function of MRAM.

20 Claims, 2 Drawing Sheets

NON-FERROMAGNETIC SPACING COMPOSITE LAYER, ITS METHOD, SYNTHETIC ANTIFERROMAGNETIC LAMINATED STRUCTURE, AND MAGNETORESISTIVE RANDOM ACCESS MEMORY

CROSS-REFERENCE TO RELATED APPLICATION

Pursuant to 35 U.S.C. § 119(a), this application claims the benefits of the priority to Taiwan Patent Application No. 109130662, filed Sep. 7, 2020. The contents of the prior application are incorporated herein by its entirety.

BACKGROUND OF THE INVENTION

1. Field of the Invention

The instant disclosure relates to a non-volatile memory (NVM), particularly to a non-ferromagnetic spacing composite layer for a magnetoresistive random access memory (MRAM). In addition, the instant disclosure also relates to a method of making the non-ferromagnetic spacing composite layer, a synthetic antiferromagnetic laminated structure as well as an MRAM comprising the foresaid non-ferromagnetic spacing composite layer.

2. Description of the Prior Arts

Memory can be classified into volatile and non-volatile categories. Volatile memory loses its stored data once the power is switched off. Examples of volatile memory include dynamic random access memory (DRAM) and static random access memory (SRAM). Unlike volatile memory, non-volatile memory retains its stored data even when the power is switched off. In the non-volatile memory devices, according to whether the stored data can be rewritten at any time when in use, they can be classified into read-only memory (ROM) and flash memory. Flash memory with erasable and rewritten functions has been widely used in various electronic products; however, it cannot provide read and write speeds that keep up with the increased processor speed of the modern central processing unit (CPU) and has faced the limitations of miniaturization and efficiency optimizations. Therefore, the development of next-generation memory (NGM) is considered necessary in the era of information explosion.

Candidates of NGM include magnetoresistive random access memory, ferroelectric random access memory (FRAM), phase-change random access memory (PRAM), resistive random access memory (RRAM), and carbon nanotube random access memory (CNT-RAM). MRAM features read and write speeds comparable with SRAM, a high storage capacity like DRAM, and a cycling endurance over $10^{10}$ times more than the flash memory, making MRAM the most anticipated NGM in the markets.

The advent of MRAM elements comes from the advance of giant magnetoresistance (GMR) and spin-transfer torque (STT) effects. GMR effect is observed in a laminate composed of ferromagnetic layer/non-ferromagnetic layer/ferromagnetic layer as electrons with different spin orientations tunneling the ferromagnetic layers have different electron conductivities. The electrical resistance depends on an external magnetic field, and change of the electrical resistance can reach 100% at low temperature. STT is accomplished by the magnetic tunnel junction (MTJ) involving the tunneling magnetoresistance (TMR) effect. Unlike the laminate structure of GMR, an insulation layer which replaces the non-ferromagnetic layer is disposed between two ferromagnetic layers in an MTJ structure. When the magnetization directions of both ferromagnetic layers are parallel (P), a low electrical resistance ($R_n$) is measured. When the magnetization directions of both ferromagnetic layers are antiparallel (AP), a high electrical resistance (RAP) is measured. The change of the electrical resistance, which is also called TMR ratio and defined by $$TMR(\%) = \frac{R_{AP} - R_P}{R_P} \times 100\%,$$

can be typically above 100% by controlling the magnetization direction of two ferromagnetic layers to be parallel or antiparallel, resulting in that MTJ becomes the basic unit for information storage in MRAM element.

At the early stage of development, the shape magnetic anisotropy of the ferromagnetic layer rendered the magnetic moment in MTJ horizontal magnetic anisotropy (HMA). Therefore, neither the adoption of specific material or structure system nor an additional thermal treatment is required, making the process and material design of said MTJ structure simple and easy. However, the MTJ structure with HMA still has a problem of insufficient thermal stability.

Thermal Stability, denoted by Δ, can be evaluated by the calculation of $$\Delta = \frac{M_S H_k V}{2 k_B T}$$

in which $M_S$, $H_k$, V, $k_B$, and T are saturated magnetization, anisotropic field, volume, Boltzmann constant, and absolute temperature, respectively. The less the value of A, the inferior the thermal stability, resulting in that the free layer is more likely to spontaneously switch its magnetic state and causes the recording error. To meet the back-end process, the thermal stability of MRAM elements is currently required to be at least 40, or even 60 or more. However, it is difficult for the MTJ structure with HMA to meet the foresaid criteria.

The magnetic anisotropy of the MTJ structure has been shifted from HMA to perpendicular magnetic anisotropy (PMA) to overcome the problem of insufficient thermal stability of MTJ structure with HMA and to achieve the goal of miniaturization of elements. However, the PMA cannot be increased to a certain level unless the magneto-crystalline anisotropy and the interface magnetic anisotropy of the material are modified. For instance, either the use of a relatively high (111)-oriented FePt layer or growth of the multilayered ferromagnetic laminate, such as [Co/Pd]$_n$ laminate, [Co/Pt]$_n$ laminate, and [Co/Ni]$_n$ laminate, on a (111)-oriented seed layer made of tantalum, palladium, platinum, or ruthenium is useful to enhance PMA. Nevertheless, the foresaid methods would bring problems of process complexity and control difficulty, and the thermal stability of the MTJ structure with PMA also needs to be optimized.

With reference to FIG. 1, a basic structure of MRAM element mainly comprises a bottom electrode 10, a pinning layer 20, a reference layer 30 (also called pinned layer), a tunneling barrier layer 40, a free layer 50, and a top electrode 60. The MTJ structure for information storage consists of the ferromagnetic reference layer 30 and the ferromagnetic free layer 50 separated by an insulating tunneling barrier layer 40, such as magnesium oxide layer.

The pinning layer in MRAM element is designed to fix the magnetization direction of the reference layer. For the reference layer, one of the important requirements is that its magnetization direction has to be fixed all the time even under excessive current, heat or magnetic field, so that the spin directions of the tunneling or polarized electrons can be maintained. Unlike the fixed magnetization direction of the reference layer, the magnetization direction of the free layer can be switched with STT effect by micro-current injection, allowing the magnetization directions of the free layer and the reference layer to be paired as parallel or antiparallel state. As stated above, when the magnetization directions of the free layer and the reference layer are parallel, electrons tunnel through the tunneling barrier layer more easily, exhibiting a low resistance state (LRS) recorded as "0". In contrast, when the magnetization directions of the free layer and the reference layer are antiparallel, electrons tunnel through the tunneling barrier layer more hardly, exhibiting a high resistance state (HRS) stored as "1". The information can be stored by the switching of the "0" and "1" states.

Considering the foresaid problem of insufficient thermal stability, an antiferromagnetic material (AFM) is currently adopted to prepare the pinning layer of MRAM element. With the relatively high coupling strength (J) and the ability of prevention of thermal disturbance, AFM is suitable to reduce the complexities of materials and multilayers and simplify the process of MRAM element.

AFM includes two categories, which are natural antiferromagnetic material and synthetic antiferromagnetic material (SAF). Natural antiferromagnetic material is generally manganese alloy, such as FeMn alloy, IrMn alloy, and PtMn alloy. The natural antiferromagnetic material achieves high coupling strength by the exchange bias effect, and exhibits the advantages of improved thermal stability and relatively simplified material. However, the natural antiferromagnetic material itself is unlikely to provide perpendicular magnetic anisotropy, and it possesses zero net magnetic moment. The selection of manganese would affect the magnetic property and TMR effect due to its characteristic of easy diffusion and also brings an issue of high price. SAF is a laminate mainly composed of ferromagnetic layer/non-ferromagnetic layer/ferromagnetic layer. The known ferromagnetic layer currently used in SAF may be a Co/Pd laminate or a Co/Pt laminate, and the known non-ferromagnetic layer may be a ruthenium layer or an iridium layer. SAF obtains a satisfactory coupling strength through Ruderman-Kittel-Kasuya-Yosida (RKKY) indirect interaction, and the net magnetic moment of SAF can be determined by the difference of magnetic moments of two ferromagnetic layers. However, SAF still has a major problem of poor thermal stability.

Coupling strength is generally inversely proportional to the temperature. As the temperature rises, the coupling strength drops sharply, then losing the RKKY indirect interaction. This generates a dipole interaction between the reference layer and the free layer in MTJ structure, and thus influences the magnetic property of the overall MRAM element.

Further, the MRAM element involves two indispensable thermal treatment stages. One is an annealing thermal treatment, which is used to enhance TMR effect and PMA, while the other is a thermal treatment of back-end of line (BEOL) for complementary metal-oxide-semiconductor (CMOS). The temperature of thermal treatment of BEOL is mostly as high as 500° C. Such a high temperature will inevitably cause the coupling strength of the non-ferromagnetic layer of SAF in MRAM element to drop suddenly and lose RKKY indirect interaction. In several severe cases, a serious damage of the magnetic property of MTJ structure would be caused, finally losing the recording function.

As a result, how to reduce the temperature of thermal treatment or how to improve the overall thermal stability or thermal durability of the MRAM element become the key issue for integrating the MRAM element into the semiconductor manufacturing process.

Currently, the temperature of the BEOL thermal treatment has been, to the utmost, reduced to 450° C. However, how to ensure that the SAF exhibits the RKKY indirect interaction after 450° C. of thermal treatment is still a major topic for the purpose of integrating the MRAM element into the semiconductor manufacturing process.

Nowadays, ruthenium is the most commonly used material for the non-ferromagnetic layer in SAF, and the non-ferromagnetic layer is generally in a thickness of about 0.8 nanometers (nm) to 0.9 nm. The coupling strength will drop suddenly and even drop to zero after the non-ferromagnetic layer is thermally treated at a temperature of 450° C. or more. It makes the SAF lose RKKY indirect interaction, leading to serious damage to magnetic property of MTJ structure and even a loss of the recording function.

Therefore, there is still a need to improve the non-ferromagnetic layer of SAF, so that the problems of serious drop of coupling strength due to high temperature thermal treatment, a loss of RKKY indirect interaction, and even a loss of recording function of MTJ structure, which are caused by choosing SAF as the pinning layer of MRAM, could be mitigated.

SUMMARY OF THE INVENTION

In view of the problems in the prior art, an objective of the instant disclosure is to develop a synthetic antiferromagnetic laminated structure which can maintain its coupling strength at a certain level after being subjected to thermal treatment at 450° C., and thereby ensuring the RKKY indirect interaction.

Another objective of the instant disclosure is to improve the thermal durability of the synthetic antiferromagnetic laminated structure, so that it is able to withstand a thermal treatment at 450° C. as well as maintain its coupling strength at a certain level, ensuring that the synthetic antiferromagnetic laminated structure can withstand two thermal treatment stages during the process of MRAM element and thus it is applicable to the MRAM element.

To achieve the foresaid objectives, the instant disclosure provides a non-ferromagnetic spacing composite layer for a synthetic antiferromagnetic laminated structure. The non-ferromagnetic spacing composite layer comprises a first spacing layer, a second spacing layer, and a third spacing layer, and the second spacing layer is disposed between the first and third spacing layers. The first spacing layer and the third spacing layer each independently comprise a material selected from the group consisting of: rhenium (Re), rhodium (Rh), iridium (Ir), tungsten (W), molybdenum (Mo), tantalum (Ta), niobium (Nb), and any combinations thereof, and a material of the second spacing layer is ruthenium (Ru). A thickness of the second spacing layer is more than or equal to 0.18 nanometers (nm), and a total thickness of the first spacing layer, the second spacing layer, and the third spacing layer is more than or equal to 0.6 nm and less than or equal to 1 nm.

With the design of the specific multilayer laminated structure, materials, thickness of the second spacing layer, and the total thickness of the overall structure, the non-ferromagnetic spacing composite layer applied to the synthetic antiferromagnetic laminated structure can maintain the coupling strength at a certain level and ensure the RKKY indirect interaction even after high temperature thermal treatment. Therefore, when the synthetic antiferromagnetic laminated structure is chosen as the pinning layer of MRAM element, a dipole interaction between the reference layer and the free layer of the MTJ structure can be avoided, which ensures that the MTJ structure exhibits the recording function.

Preferably, the thickness of the second spacing layer may be more than or equal to 0.18 nm and less than or equal to 0.65 nm.

Preferably, a thickness of the first spacing layer may be more than 0 nm and less than or equal to 0.25 nm, and a thickness of the third spacing layer may be more than 0 nm and less than or equal to 0.25 nm. In one of the embodiments, the thickness of the first spacing layer may be more than or equal to 0.10 nm and less than or equal to 0.23 nm, and the thickness of the third spacing layer may be more than or equal to 0.10 nm and less than or equal to 0.23 nm. In another embodiment, the thickness of the first spacing layer may be more than or equal to 0.15 nm and less than or equal to 0.20 nm, and the thickness of the third spacing layer may be more than or equal to 0.15 nm and less than or equal to 0.20 nm. In another further embodiment, the thickness of the first spacing layer may be more than or equal to 0.21 nm and less than or equal to 0.25 nm, and the thickness of the third spacing layer may be more than or equal to 0.21 nm and less than or equal to 0.25 nm. In accordance with the instant disclosure, the thickness of the first spacing layer and the thickness of the third spacing layer may be the same or different.

In one of the embodiments, the first spacing layer and the third spacing layer each independently comprise the material of Re, Ir, Mo, W, Ta, or any combinations thereof. In another embodiment, the first spacing layer and the third spacing layer each independently comprise the material of Re, Ir, or their combination. In accordance with the instant disclosure, the material of the first spacing layer and the material of the third spacing layer may be the same or different.

To achieve the foresaid objectives, the instant disclosure also provides a method of preparing the foresaid non-ferromagnetic spacing composite layer. The method comprises steps of:

sputtering a first sputtering target to form a first spacing layer;

sputtering a second sputtering target to form a second spacing layer on the first spacing layer; and sputtering a third sputtering target to form a third spacing layer on the second spacing layer;

wherein the first sputtering target and the third sputtering target are each independently selected from the group consisting of: a rhenium sputtering target, a rhodium sputtering target, an iridium sputtering target, a tungsten sputtering target, a molybdenum sputtering target, a tantalum sputtering target, a niobium sputtering target, and any combinations thereof, and the second sputtering target is a ruthenium sputtering target.

In accordance with the instant disclosure, the non-ferromagnetic spacing composite layer can be obtained by sputtering the sputtering targets of specific materials in sequence, so that the non-ferromagnetic spacing composite layer can have specific multilayer laminated structure, materials, thickness of the second spacing layer, and the total thickness of the overall structure, and therefore exhibit the advantages and beneficial effects as mentioned above.

In accordance with the instant disclosure, the first to third sputtering targets may be sputtered by magnetron sputtering. In one of the embodiments, the magnetron sputtering may be carried out under a vacuum environment, in which the pressure may be less than $1 \times 10^{-7}$ torr or in a range of $1 \times 10^{-8}$ torr to $1 \times 10^{-7}$ torr, but it is not limited thereto.

In the magnetron sputtering process, the power density and working pressure can be adjusted depending on the material of the sputtering target. In one of the embodiments, the power density may be set in a range from 2 milliwatts per square millimeter ($mW/mm^2$) to 20 $mW/mm^2$, and the working pressure may be set in a range from 0.1 millitorr (mtorr) to 20 mtorr, but both are not limited thereto. In another embodiment, the power density may be set in a range from 2 $mW/mm^2$ to 15 $mW/mm^2$, and the working pressure can be set in a range from 0.5 mtorr to 10 mtorr.

In accordance with the instant disclosure, the rhenium sputtering target, the rhodium sputtering target, the iridium sputtering target, the tungsten sputtering target, the molybdenum sputtering target, the tantalum sputtering target, the niobium sputtering target, and the ruthenium sputtering target each may have a purity higher than 99.9 weight percent (wt %) or higher than 99.9 wt %. Accordingly, the non-ferromagnetic spacing composite layer of high purity can be obtained by sputtering these sputtering targets.

To achieve the foresaid objectives, the instant disclosure further provides a synthetic antiferromagnetic laminated structure, which comprises a first ferromagnetic layer, the foresaid non-ferromagnetic spacing composite layer, and a second ferromagnetic layer, wherein the first spacing layer of the non-ferromagnetic spacing composite layer is disposed between the first ferromagnetic layer and the second spacing layer of the non-ferromagnetic spacing composite layer, and the third spacing layer of the non-ferromagnetic spacing composite layer is disposed between the second spacing layer of the non-ferromagnetic spacing composite layer and the second ferromagnetic layer.

With the non-ferromagnetic spacing composite layer of the instant disclosure, the synthetic antiferromagnetic laminated structure can maintain its coupling strength at a certain level after high temperature thermal treatment, and thereby ensuring the RKKY indirect interaction. Adopting such a synthetic antiferromagnetic laminated structure as a pinning layer of the MRAM element can avoid the dipole interaction between the reference layer and the free layer in MTJ structure generated by the high temperature thermal treatment and ensure that the MTJ structure exhibits the recording function. Accordingly, the synthetic antiferromagnetic laminated structure of the instant disclosure can be applicable to MRAM element and chosen as a pinning layer thereof.

In one of the embodiments, the first ferromagnetic layer and the second ferromagnetic layer may be each independently selected from the group consisting of: a cobalt (Co) layer, a nickel (Ni) layer, an iron (Fe) layer, a cobalt-iron (CoFe) layer, a cobalt-platinum (CoPt) layer, a cobalt-palladium (CoPd) layer, a cobalt-nickel (CoNi) layer, an iron-platinum (FePt) layer, an iron-palladium (FePd) layer, an iron-boron (FeB) layer, a cobalt-iron-boron (CoFeB) layer, and any combinations thereof, but is not limited thereto. In one of the embodiments, the first ferromagnetic layer may be a single metal layer, a single metal alloy layer, a combination of any one of foresaid metal layers and/or foresaid metal alloy layers. For example, the first ferromagnetic layer may be a $[Co/Pd]_n$ laminate composed of at least one cobalt layer and at least one palladium layer, a $[Co/Pt]_n$ laminate composed of at least one cobalt layer and at least one platinum layer, or a $[Co/Ni]_n$ laminate composed of at least one cobalt layer and at least one nickel layer, but is not limited thereto. Likely, the second ferromagnetic layer may be any one of the combinations of foresaid layers. In accordance with the instant disclosure, the first ferromagnetic layer and the second ferromagnetic layer may be the same or different.

In one of the embodiments, a thickness of the first ferromagnetic layer may be more than 0 nm and less than 5.0 nm, and a thickness of the second ferromagnetic layer may be more than 0 nm and less than 5.0 nm. In another embodiment, the thickness of the first ferromagnetic layer may be more than or equal to 0.3 nm and less than or equal to 3.0 nm, and the thickness of the second ferromagnetic layer may be more than or equal to 0.3 nm and less than or equal to 3.0 nm. In further another embodiment, the thickness of the first ferromagnetic layer may be more than or equal to 0.3 nm and less than or equal to 2.0 nm, and the thickness of the second ferromagnetic layer may be more than or equal to 0.3 nm and less than or equal to 2.0 nm.

To achieve the foresaid objectives, the instant disclosure further provides a magnetoresistive random access memory, which comprises a bottom electrode, a pinning layer, a reference layer, a tunneling barrier layer, a free layer, and a top electrode from bottom to top, wherein the pinning layer comprises the synthetic antiferromagnetic laminated structure.

In accordance with the instant disclosure, adopting the synthetic antiferromagnetic laminated structure as the pinning layer can maintain the coupling strength at a certain level as well as the RKKY indirect interaction even after high temperature thermal treatment, such that the expected recording function the MTJ structure of the MRAM element is provided.

In one of the embodiments, the bottom electrode, the pinning layer, the reference layer, the tunneling barrier layer, the free layer, and the top electrode are sequentially stacked in a vertical arrangement. The magnetization directions of the reference layer and of the free layer may be parallel or perpendicular to the stacking direction.

In accordance with the instant disclosure, a material of the top electrode and a material of the bottom electrode may each independently be Ta, Ru, tantalum mononitride (TaN), titanium mononitride (TiN) or any combinations thereof, but are not limited thereto. One person skilled in the art can adjust the thicknesses of the top electrode and the bottom electrode based on the multilayer design of MRAM. The materials of the top and bottom electrodes may be the same or different, and the thicknesses of the top and bottom electrodes may be the same or different.

In accordance with the instant disclosure, a material of the reference layer and a material of the free layer may each independently be, but not limited to, Co, Ni, Fe, CoFe, CoPt, CoPd, CoNi, FePt, FePd, FeB, CoFeB, or any combinations thereof. The thickness of the reference layer and the thickness of the free layer may be each independently in a range from 0.1 nm to 2.0 nm. The materials of the reference layer and the free layer may be the same or different, and the thicknesses of the reference layer and the free layer may be the same or different.

In accordance with the instant disclosure, a material of the tunneling barrier layer may be, but not limited to, magnesium oxide (MgO), ruthenium oxide (RuO), tantalum oxide (TaO), aluminium(III) trioxide ($Al_2O_3$) gallium(III) trioxide ($Ga_2O_3$), or any combinations thereof. A thickness of the tunneling, barrier layer may be in a range from 0.1 nm to 1.0 nm.

In addition to the foresaid multilayers, MRAM may comprise, depending on different needs, other additional layers, for example, but not limited to, a capping layer. The capping layer may be disposed between the free layer and the top electrode, and the capping layer has a thickness in a range of 0.1 nm to 2.0 nm.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
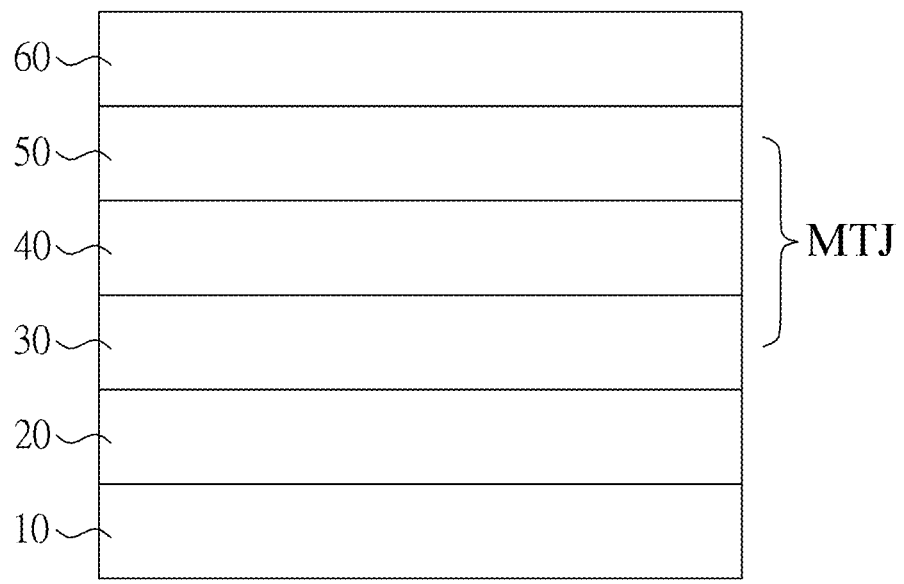
FIG. 1 is a schematic view of a brief structure of a general MRAM element.

Hereinafter, several examples are exemplified to illustrate the implementation of the instant disclosure. One person skilled in the art can easily realize the advantages and effects of the instant disclosure in accordance with the contents of the specification. Various modifications and variations could be made in order to practice or apply the instant disclosure without departing from the spirit and scope of the invention.

Examples 1 to 12 (E1 to E12): Non-Ferromagnetic Spacing Composite Layer

A clean silicon substrate was put into a chamber of an ultra-high vacuum magnetron sputtering device (manufacturer: ULVAC Taiwan Inc.). After the chamber pressure was reduced to $8 \times 10^{-8}$ torr, a rhenium sputtering target, a ruthenium sputtering target, and another rhenium sputtering target, were respectively sputtered with a power density of about 3.3 mW/mm$^2$ and under a working pressure of about 3 mtorr, so as to deposit a rhenium layer (first spacing layer), a ruthenium layer (second spacing layer), and another rhenium layer (third spacing layer) each having specific thickness on the silicon substrate from bottom to top, and thus the non-ferromagnetic spacing composite layer was obtained on the silicon substrate. The composition of the non-ferromagnetic spacing composite layer was represented by Re/Ru/Re in Table 1 below.

In the non-ferromagnetic spacing composite layers of Examples 1 to 7, the thickness of each rhenium layer was about 0.18 nm. In the non-ferromagnetic spacing composite layers of Examples 8 to 12, the thickness of each rhenium layer was about 0.23 nm. The rhenium layer having specific thickness was associated with ruthenium layers of different thicknesses as shown in Table 1, and the total thicknesses of the non-ferromagnetic spacing composite layers of Examples 1 to 12 were also listed in Table 1 below.

Comparative Example 1 (C1): Non-ferromagnetic Spacing Layer

A clean silicon substrate was put into the foresaid chamber of the ultra-high vacuum magnetron sputtering device.

After the chamber pressure was reduced to $8\times10^{-8}$ torr, a ruthenium sputtering target was sputtered with a power density of about 3.3 mW/mm² and under a working pressure of about 3 mtorr, so as to deposit a ruthenium layer, i.e., non-ferromagnetic spacing layer, in a thickness of about 0.79 nm on the silicon substrate.

Unlike Examples 1 to 12, the non-ferromagnetic spacing layer of Comparative Example 1 was a single ruthenium layer, whose composition was represented by Ru in Table 1.

Comparative Example 2 (C2): Non-Ferromagnetic Spacing Layer

A clean silicon substrate was put into the foresaid chamber of the ultra-high vacuum magnetron sputtering device. After the chamber pressure was reduced to $8\times10^{-8}$ torr, a rhenium sputtering target was sputtered with a power density of about 3.3 mW/mm² and under a working pressure of about 3 mtorr, so as to deposit a rhenium layer, i.e., non-ferromagnetic spacing layer, in a thickness of about 0.79 nm on the silicon substrate.

Unlike Examples 1 to 12, the non-ferromagnetic spacing layer of Comparative Example 2 was a single rhenium layer, whose composition was represented by Re in Table 1.

Comparative Example 3 (C3): Non-Ferromagnetic Spacing Composite Layer

A clean silicon substrate was put into the foresaid chamber of the ultra-high vacuum magnetron sputtering device. After the chamber pressure was reduced to $8\times10^{-8}$ torr, a ruthenium sputtering target and a rhenium sputtering target were respectively sputtered with a power density of about 3.3 mW/mm² and under a working pressure of about 3 mtorr, so as to deposit a ruthenium layer and a rhenium layer both having specific thicknesses on the silicon substrate from bottom to top, and thus the non-ferromagnetic spacing composite layer was obtained on the silicon substrate. The composition of the non-ferromagnetic spacing composite layer was represented by Ru/Re in Table 1 below.

Unlike Examples 1 to 12, the non-ferromagnetic spacing layer of Comparative Example 3 only comprised two layers, i.e., a ruthenium layer in a thickness of about 0.49 nm and a rhenium layer in a thickness of about 0.3 nm. The total thickness of the non-ferromagnetic spacing composite layer was listed in Table 1 below.

Comparative Example 4 (C4): Non-Ferromagnetic Spacing Composite Layer

A clean silicon substrate was put into the foresaid chamber of the ultra-high vacuum magnetron sputtering device. After the chamber pressure was reduced to $8\times10^{-8}$ torr, a rhenium sputtering target and a ruthenium sputtering target were respectively sputtered with a power density of about 3.3 mW/mm² and under a working pressure of about 3 mtorr, so as to deposit a rhenium layer and a ruthenium layer both having specific thicknesses on the silicon substrate from bottom to top, and thus the non-ferromagnetic spacing composite layer was obtained on the silicon substrate. The composition of the non-ferromagnetic spacing composite layer was represented by Re/Ru in Table 1 below.

Unlike Examples 1 to 12, the non-ferromagnetic spacing layer of Comparative Example 4 only comprised two layers, i.e., a rhenium layer in a thickness of about 0.3 nm and a ruthenium layer in a thickness of about 0.49 nm. The total thickness of the non-ferromagnetic spacing composite layer was listed in Table 1 below.

Comparative Example 5 (C5): Non-Ferromagnetic Spacing Composite Layer

A clean silicon substrate was put into the foresaid chamber of the ultra-high vacuum magnetron sputtering device. After the chamber pressure was reduced to $8\times10^{-8}$ torr, a platinum sputtering target was first sputtered with a power density of about 3.3 mW/mm² and under a working pressure of about 7 mtorr, so as to deposit a platinum layer in a thickness of about 0.18 nm on the silicon substrate. Then a ruthenium sputtering target was sputtered with a power density of about 3.3 mW/mm² and under a working pressure of about 3 mtorr, so as to deposit a ruthenium layer in a thickness of about 0.43 nm on the platinum layer. Finally, another platinum sputtering target was sputtered with a power density of about 3.3 mW/mm² and under a working pressure of about 7 mtorr, so as to deposit another platinum layer in a thickness of about 0.18 nm on the ruthenium layer. Thus, the non-ferromagnetic spacing composite layer was obtained on the silicon substrate.

For the non-ferromagnetic spacing composite layer of Comparative Example 5, two rhenium layers of Examples 1 to 12 were replaced by two platinum layers, and its composition was represented by Pt/Ru/Pt in Table 1. The total thickness of the non-ferromagnetic spacing composite layer was also listed in Table 1.

Comparative Examples 6 to 8 (C6 to C8): Non-Ferromagnetic Spacing Composite Layer The non-ferromagnetic spacing composite layers of Comparative Examples 6 to 8 were prepared by the method similar to that as described in Examples 1 to 12 except that the differences therebetween were the thickness of the second spacing layer and the total thickness of the non-ferromagnetic spacing composite layer. Like Examples 1 to 7, the thickness of each rhenium layer in Comparative Examples 6 and 7 was about 0.18 nm. Like Examples 8 to 12, the thickness of each rhenium layer in Comparative Example 8 was about 0.23 nm. The rhenium layer having a specific thickness was associated with ruthenium layers of different thicknesses as shown in Table 1, and the total thicknesses of the non-ferromagnetic spacing composite layers of Comparative Examples 6 to 8 were also listed in Table 1 below.

Examples 1A to 12A and Comparative Examples 1A to 8A: Synthetic Antiferromagnetic Laminated Structure A clean silicon substrate was used. A cobalt sputtering target was sputtered with a power density of about 6.6 mW/mm² and under a working pressure of about 3 mtorr, so as to deposit a cobalt layer in a thickness of about 0.6 nm on the silicon substrate. Then a platinum sputtering target was sputtered with a power density of about 3.3 mW/mm² and under a working pressure of about 7 mtorr, so as to deposit a platinum layer in a thickness of about 1 nm on the cobalt layer. Subsequently, a cobalt sputtering target was sputtered with a power density of about 6.6 mW/mm² and under a working pressure of about 3 mtorr, so as to deposit a cobalt layer in a thickness of about 0.6 nm on the platinum layer.

Therefore, a Co/Pt/Co laminate as the first ferromagnetic layer was deposited on the silicon substrate.

After that, the non-ferromagnetic spacing composite layers of Examples 1 to 12 and Comparative Examples 3 to 8 as well as the non-ferromagnetic spacing layers of Comparative Examples 1 and 2 were each prepared by the methods as described in Examples 1 to 12 and Comparative Examples 3 to 8 as well as Comparative Examples 1 and 2, and deposited on the Co/Pt/Co laminate (the first ferromagnetic layer).

Then a cobalt layer of about 0.6 nm was deposited on either the non-ferromagnetic spacing composite layer or the non-ferromagnetic spacing layer by sputtering a cobalt sputtering target with a power density of about 6.6 mW/mm$^2$ and under a working pressure of about 3 mtorr. Then a platinum layer of about 1 nm was further deposited on the foresaid cobalt layer by sputtering a platinum sputtering target with a power density of about 3.3 mW/mm$^2$ and under a working pressure of about 7 mtorr, and another cobalt layer of about 0.6 nm was deposited on the platinum layer by sputtering a cobalt sputtering target with a power density of about 6.6 mW/mm$^2$ and under a working pressure of about 3 mtorr. After that, another Co/Pt/Co laminate as the second ferromagnetic layer was deposited on the foresaid non-ferromagnetic spacing composite layer or the foresaid non-ferromagnetic spacing layer.

According to the foresaid preparation method, the first ferromagnetic layer, a spacing layer, and the second ferromagnetic layer were respectively deposited on the silicon substrate, so as to obtain the synthetic antiferromagnetic laminated structure of each of the Examples 1A to 12A and Comparative Examples 1A to 8A. The spacing layers comprised in the synthetic antiferromagnetic laminated structures of Examples 1A to 12A and Comparative Examples 1A to 8A were respectively the foresaid non-ferromagnetic spacing composite layers of Examples 1 to 12, the foresaid non-ferromagnetic spacing layers of Comparative Examples 1 and 2, and the foresaid non-ferromagnetic spacing composite layers of Comparative Examples 3 to 8.

TABLE 1 the composition, thickness of Ru layer, and total thicknesses of each of the non-ferromagnetic spacing composite layers of Examples 1 to 12 and Comparative Examples 3 to 8 and the non-ferromagnetic spacing layers of Comparative Examples 1 and 2 as well as the coupling strengths of the samples comprising the same before and after annealing

| | Non-ferromagnetic Spacing Composite Layer/Non-ferromagnetic Spacing Layer | | | Coupling Strength (erg/cm$^2$) | | |
|---|---|---|---|---|---|---|
| | Comp. | Thickness of Ru layer (nm) | Total Thickness (nm) | Before Annealing | After 400° C. Annealing | After 450° C. Annealing |
| E1 | Re/Ru/Re | 0.43 | 0.79 | 0.68 | 0.43 | 0.33 |
| E2 | Re/Ru/Re | 0.24 | 0.60 | 0.67 | 0.38 | 0.16 |
| E3 | Re/Ru/Re | 0.30 | 0.66 | 0.72 | 0.44 | 0.19 |
| E4 | Re/Ru/Re | 0.36 | 0.72 | 0.70 | 0.47 | 0.24 |
| E5 | Re/Ru/Re | 0.49 | 0.85 | 0.54 | 0.40 | 0.30 |
| E6 | Re/Ru/Re | 0.55 | 0.91 | 0.37 | 0.26 | 0.24 |
| E7 | Re/Ru/Re | 0.61 | 0.97 | 0.21 | 0.18 | 0.19 |
| E8 | Re/Ru/Re | 0.18 | 0.64 | 0.54 | 0.34 | 0.21 |
| E9 | Re/Ru/Re | 0.24 | 0.70 | 0.56 | 0.39 | 0.28 |
| E10 | Re/Ru/Re | 0.30 | 0.76 | 0.40 | 0.22 | 0.11 |
| E11 | Re/Ru/Re | 0.36 | 0.82 | 0.40 | 0.32 | 0.23 |
| E12 | Re/Ru/Re | 0.43 | 0.89 | 0.30 | 0.22 | 0.15 |
| C1 | Ru | 0.79 | 0.79 | 1.05 | 0.77 | 0 |
| C2 | Re | 0 | 0.79 | 0.45 | 0.29 | 0.06 |
| C3 | Ru/Re | 0.49 | 0.79 | 0.86 | 0.72 | 0.09 |
| C4 | Re/Ru | 0.49 | 0.79 | 0.80 | 0.50 | 0 |
| C5 | Pt/Ru/Pt | 0.43 | 0.79 | 0.86 | 0.32 | 0 |
| C6 | Re/Ru/Re | 0.18 | 0.54 | 0.42 | 0.11 | 0 |
| C7 | Re/Ru/Re | 0.67 | 1.03 | 0.09 | 0.11 | 0.09 |
| C8 | Re/Ru/Re | 0.15 | 0.61 | 0.42 | 0.13 | 0.06 |

Test Example: Coupling Strength

To measure the coupling strengths of synthetic antiferromagnetic laminated structures of the Examples 1A to 12A and Comparative Examples 1A to 8A, the specimens of the samples were prepared by the same method as described below.

First, a clean silicon substrate was put into the foresaid chamber of the ultra-high vacuum magnetron sputtering device. After the chamber pressure was reduced to $8\times10^{-8}$ torr, a tantalum sputtering target was sputtered with a power density of about 6.6 mW/mm$^2$ and under a working pressure of about 3 mtorr, so as to deposit a tantalum layer in a thickness of about 5 nm on the silicon substrate. Followed up, a platinum sputtering target was sputtered with a power density of about 13 mW/mm$^2$ and under a working pressure of about 1 mtorr, so as to deposit a platinum layer in a thickness of about 5 nm on the tantalum layer.

After that, the synthetic antiferromagnetic laminated structure as described in each of the Examples 1A to 12A and Comparative Examples 1A to 8A was deposited on the platinum layer. Then a platinum sputtering target was further sputtered with a power density of about 3.3 mW/mm$^2$ and under a working pressure of about 7 mtorr, so as to deposit another platinum layer in a thickness of about 2 nm, as a seed layer, on the Co/Pt/Co laminate of the synthetic antiferromagnetic laminated structure. Samples for the measurement of coupling strength were obtained.

According to the foresaid preparation method, each sample comprised a silicon substrate, a tantalum layer, a platinum layer, a Co/Pt/Co laminate, a non-ferromagnetic spacing composite layer or non-ferromagnetic spacing layer, another Co/Pt/Co laminate, and another platinum layer from bottom to top. Herein, the laminated structure comprising the foresaid Co/Pt/Co laminate (the foresaid first ferromagnetic layer), the non-ferromagnetic spacing composite layer or non-ferromagnetic spacing layer, said another Co/Pt/Co laminate (the foresaid second ferromagnetic layer) stacked together could correspond to the synthetic antiferromagnetic laminated structure as described in each of Examples 1A to 12A and Comparative Examples 1A to 8A.

The specimens of the samples were measured with a vibrating sample magnetometer (VSM, manufacturer: Lakeshore, model: MicroMag 3900), and then the respective M-H hysteresis curves were obtained. The saturation magnetization denoted by $M_S$ and the exchange field denoted by $H_{ex}$ could be obtained from the respective curve. Based on the calculation, $J_{ex}=M_S t H_{ex}$, the coupling strengths of as-deposited samples comprising the synthetic antiferromagnetic laminated structure could be obtained. The results were listed in the column of "before annealing" in Table 1 with a unit of erg per square centimeter (erg/cm$^2$).

After the measurement of M-H hysteresis curves of the as-deposited samples, two specimens of each sample were put in a vacuum annealing furnace and respectively annealed at 400° C. and 450° C. each for an hour when the pressure of the furnace was reduced to 5×10$^{-5}$ torr. After annealing, the two specimens of each sample were measured to obtain their M-H hysteresis curves. After that, the coupling strengths of specimens, which were annealed at specific temperatures, of the each sample comprising the synthetic antiferromagnetic laminated structure could be calculated by the calculation.

The measured coupling strengths of each sample, including before and after annealing, were listed in the above Table 1.

In addition to the annealing thermal treatment at 400° C. and 450° C., the samples of respectively comprising the synthetic antiferromagnetic laminated structures of Comparative Example 1A (C1A), Comparative Example 5A (C5A), Example 1A (E1A), and Example 11A (E11A) were chosen to be performed with an annealing thermal treatment at 350° C., 400° C., 425° C., and 450° C. According to the foresaid testing method, the results of coupling strengths for these four samples before annealing and after annealing at 350° C., 400° C., 425° C., and 450° C. were listed in the following Table 2 and shown in FIG. 2.

TABLE 2 coupling strengths of samples comprising the synthetic antiferromagnetic laminated structures of Comparative Example 1A, Comparative Example 5A, Example 1A, and Example 11A before and annealing at specific temperatures for an hour

| | Coupling Strength (erg/cm$^2$) | | | |
| --- | --- | --- | --- | --- |
| | C1A | C5A | E1A | E11A |
| Before annealing | 1.05 | 0.86 | 0.68 | 0.40 |
| Annealing at 350° C. for an hour | 0.67 | 0.62 | 0.53 | 0.39 |
| Annealing at 400° C. for an hour | 0.77 | 0.32 | 0.43 | 0.32 |
| Annealing at 425° C. for an hour | 0.50 | 0.06 | 0.34 | 0.28 |
| Annealing at 450° C. for an hour | 0 | 0 | 0.33 | 0.23 |

Discussion of Results

As shown in Table 1, the synthetic antiferromagnetic laminated structures of Examples 1A to 12A all could maintain their coupling strengths at a level of equal to or more than 0.10 erg/cm$^2$ even if they were annealed at 400° C. or 450° C. for an hour. It can be seen that MRAM elements comprising the synthetic antiferromagnetic laminated structures, which respectively comprised the non-ferromagnetic spacing composite layers of Examples 1 to 12, as a pinning layer could withstand the annealing thermal treatment for MTJ structure and thermal treatment of BEOL for CMOS without a loss of the RKKY indirect interaction. Thus, the use of the non-ferromagnetic spacing composite layers of Examples 1 to 12 was able to avoid a serious damage of the magnetic property of the MTJ structure caused by high temperature thermal treatment as well as to ensure the original expected recording function of the MTJ structure after high temperature thermal treatment. In comparison with Examples 1 to 12, the coupling strengths of the synthetic antiferromagnetic laminated structures of Comparative Examples 1A to 8A were all less than 0.10 erg/cm$^2$ after annealed at 450° C. for an hour. Moreover, the coupling strengths of the synthetic antiferromagnetic laminated structures of Comparative Examples 1A and 4A to 6A drop sharply to 0 erg/cm$^2$ after annealed at 450° C. for an hour, leading to a loss of the RKKY indirect interaction. Therefore, for the MRAM elements comprising those of the comparative examples, the magnetic property of the MTJ structure was seriously damaged and the recording function was lost after subjected to the high temperature thermal treatment, resulting in that the MRAM element had difficulties being integrated into the semiconductor manufacturing process.

From the multilayer laminated structures and results of the non-ferromagnetic spacing layers of Comparative Examples 1 and 2 as well as the non-ferromagnetic spacing composite layers of Comparative Examples 3 and 4, although similar materials (Re and/or Ru) were adopted in Comparative Examples 1 to 4, the coupling strengths of the synthetic antiferromagnetic laminated structures of Comparative Examples 1A to 4A, whether they comprised either single layer or two layers, were much less than those of Examples 1A to 12A after annealed at 450° C. for an hour. It shows that the non-ferromagnetic spacing composite layer with specific design on the multilayer laminated structure of the instant disclosure does have its unexpected results. From the multilayer laminated structure and result of the non-ferromagnetic spacing layer of Comparative Example 5, even if the non-ferromagnetic spacing layer comprised three spacing layers, adopting other materials, such as platinum, as the first and third spacing layers led the synthetic antiferromagnetic laminated structure of Comparative Example 5A to have a coupling strength drop sharply to 0 erg/cm$^2$ after annealed at 450° C. for an hour and a loss of the RKKY indirect interaction. As a result, the synthetic antiferromagnetic laminated structure comprising the non-ferromagnetic spacing composite layer of Comparative Example 5 was not applicable to MRAM element. This also demonstrates that the non-ferromagnetic spacing composite layer of the instant disclosure, which chooses specific materials in combination, does have its unexpected results.

According to the multilayer laminated structures and results of the non-ferromagnetic spacing composite layers of Examples 1 to 7 in comparison with Comparative Examples 6 and 7, even though a similar multilayer laminated structure and the identical thicknesses of the first and third spacing layer were controlled, the coupling strengths of the synthetic antiferromagnetic laminated structures (Comparative Examples 6A and 7A) still drop sharply to 0.1 erg/cm$^2$ or less after annealed at 450° C. for an hour if the total thicknesses of the non-ferromagnetic spacing composite layers comprised thereof were each less than 0.6 nm or more than 1.0 nm. The RKKY indirect interaction mostly lost. Accordingly, the synthetic antiferromagnetic laminated structures each comprising the non-ferromagnetic spacing composite layers of Comparative Examples 6 and 7 were not applicable to MRAM element. This demonstrates that the total thickness of the non-ferromagnetic spacing composite layer significantly influences the effects of MRAM element comprising the synthetic antiferromagnetic laminated structure. It also can be confirmed that the non-ferromagnetic spacing composite layer having specific total thickness does have its unexpected results. Further, a similar technical significance also could be obtained from the multilayer laminated structures and results of the non-ferromagnetic spacing composite layers of Examples 8 to 12 in comparison with Comparative Example 8. It can be confirmed again that the non-ferromagnetic spacing composite layer having specific total thickness does have its unexpected results.

Figure 2:
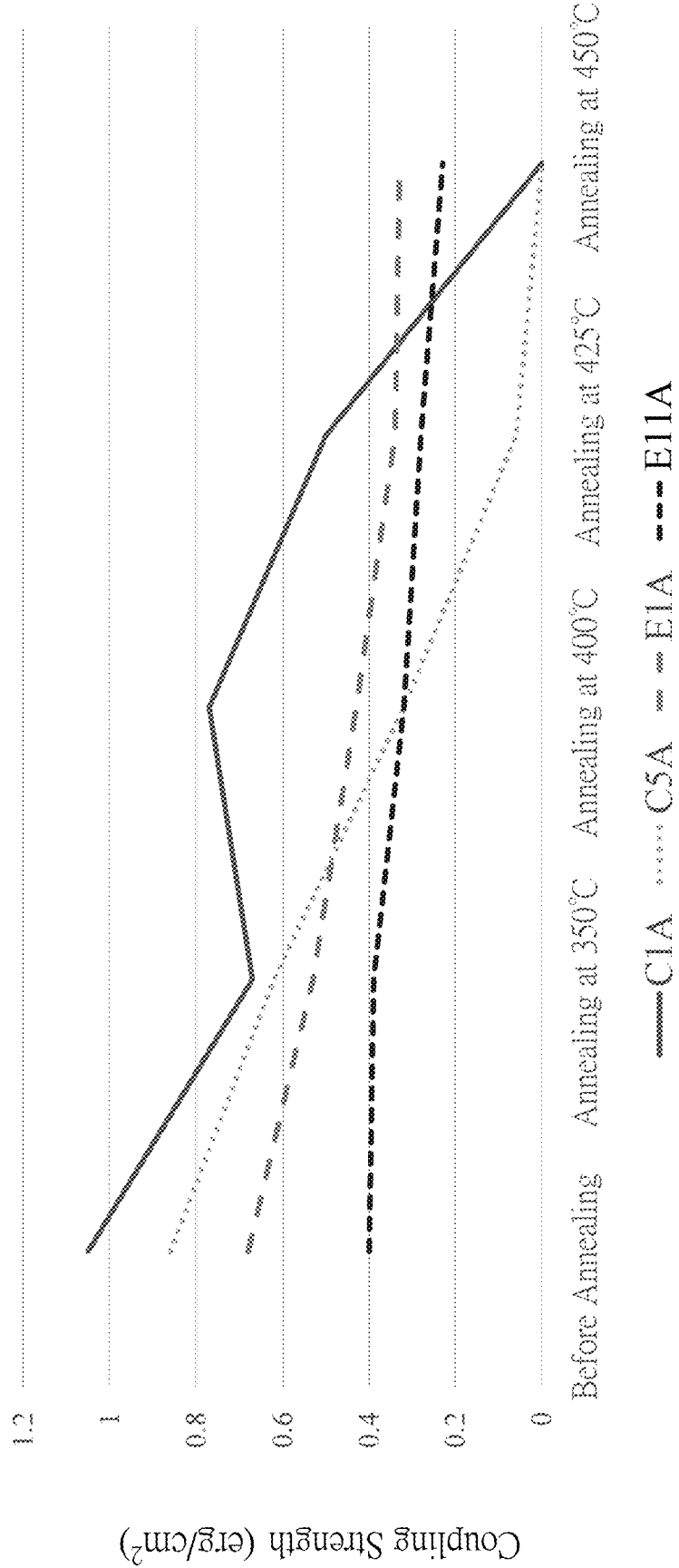
FIG. 2 illustrates the coupling strengths of samples comprising synthetic antiferromagnetic laminated structures of Comparative Example 1A, Comparative Example 5A, Example 1A, and Example 11A before and after annealing.

From the results of the above Table 2 and FIG. 2, the slope of the coupling strength curve of each of the synthetic antiferromagnetic laminated structures of Examples 1A and 11A at different temperatures of thermal treatment was gentler than that of each of Comparative Examples 1A and 5A. It shows that adopting the non-ferromagnetic spacing composite layers of Examples 1 and 11 was helpful to mitigate the negative influence of high temperature thermal treatment in MRAM process and lower the reduction level on coupling strength as much as possible. The synthetic antiferromagnetic laminated structures of Examples 1A and 11A could maintain the coupling strengths more than 0.1 erg/cm$^2$ after annealed at 450° C. for an hour while the coupling strengths of the synthetic antiferromagnetic laminated structures of Comparative Examples 1A and 5A had respectively reduced to 0 erg/cm$^2$ after annealed at 450° C. for an hour and 0.06 erg/cm$^2$ after annealed at 425° C. for an hour. Both failed to maintain their coupling strength more than 0.1 erg/cm$^2$ after annealed. Besides, the coupling strength of Comparative Example 5A dropped sharply to 0 erg/cm$^2$ after annealed at 450° C. for an hour, leading to a loss of indirect interaction. From the foresaid results, the technical means of the instant disclosure is actually beneficial to improve the thermal durability of the non-ferromagnetic spacing composite layer and the synthetic antiferromagnetic laminated structure. Similarly, from the results of Table 1, the non-ferromagnetic spacing composite layers of Examples 1 to 12 and the synthetic antiferromagnetic laminated structures comprising the same have superior thermal durability.

In summary, with the design of the specific multilayer laminated structure, the selection of specific materials, and the control of thickness of the second spacing layer as well as the total thickness of the overall structure, the synthetic antiferromagnetic laminated structure which adopts the non-ferromagnetic spacing composite layer can maintain a certain coupling strength after high temperature thermal treatment, such as the annealing thermal treatment for MTJ structure and thermal treatment of BEOL for CMOS. Therefore, the RKKY indirect interaction can be ensured even after high temperature thermal treatment. For an MTJ structure in MRAM element, a serious damage of the magnetic property due to high temperature thermal treatment can be avoided and the expected recording function of MTJ structure can be still exhibited. Therefore, the use of the non-ferromagnetic spacing composite layer as well as the synthetic antiferromagnetic laminated structure is beneficial to integrate the MRAM element into the semiconductor manufacturing process, thereby improving the applicability of MRAM element.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A non-ferromagnetic spacing composite layer for a synthetic antiferromagnetic laminated structure, comprising a first spacing layer, a second spacing layer, and a third spacing layer, the second spacing layer disposed between the first spacing layer and the third spacing layer;

wherein the first spacing layer and the third spacing layer each independently comprise a material selected from the group consisting of: rhenium, rhodium, iridium, tungsten, molybdenum, tantalum, niobium, and any combinations thereof, and the second spacing layer comprises a material of ruthenium; and wherein a thickness of the second spacing layer is more than or equal to 0.18 nanometers (nm), and a total thickness of the first spacing layer, the second spacing layer, and the third spacing layer is more than or equal to 0.6 nm and less than or equal to 1 nm.

2. The non-ferromagnetic spacing composite layer as claimed in claim 1, wherein the thickness of the second spacing layer is more than or equal to 0.18 nm and less than or equal to 0.65 nm.

3. The non-ferromagnetic spacing composite layer as claimed in claim 1, wherein a thickness of the first spacing layer is more than 0 nm and less than or equal to 0.25 nm, and a thickness of the third spacing layer is more than 0 nm and less than or equal to 0.25 nm.

4. The non-ferromagnetic spacing composite layer as claimed in claim 3, wherein the thickness of the first spacing layer is more than or equal to 0.10 nm and less than or equal to 0.23 nm, and the thickness of the third spacing layer is more than or equal to 0.10 nm and less than or equal to 0.23 nm.

5. The non-ferromagnetic spacing composite layer as claimed in claim 3, wherein the thickness of the first spacing layer is more than or equal to 0.15 nm and less than or equal to 0.20 nm, and the thickness of the third spacing layer is more than or equal to 0.15 nm and less than or equal to 0.20 nm.

6. The non-ferromagnetic spacing composite layer as claimed in claim 3, wherein the thickness of the first spacing layer is more than or equal to 0.21 nm and less than or equal to 0.25 nm, and the thickness of the third spacing layer is more than or equal to 0.21 nm and less than or equal to 0.25 nm.

7. The non-ferromagnetic spacing composite layer as claimed in claim 1, wherein a thickness of the first spacing layer and a thickness of the third spacing layer is the same or different.

8. The non-ferromagnetic spacing composite layer as claimed in claim 1, wherein the first spacing layer and the third spacing layer each independently comprise the material selected from the group consisting of: rhenium, iridium, tungsten, molybdenum, tantalum, and any combinations thereof.

9. The non-ferromagnetic spacing composite layer as claimed in claim 1, wherein the first spacing layer and the third spacing layer each independently comprise the material selected from the group consisting of: rhenium, iridium, and their combination.

10. A method of preparing the non-ferromagnetic spacing composite layer as claimed in claim 1, comprising steps of:
sputtering a first sputtering target to form a first spacing layer;
sputtering a second sputtering target to form a second spacing layer on the first spacing layer; and
sputtering a third sputtering target to form a third spacing layer on the second spacing layer;
wherein the first sputtering target and the third sputtering target are each independently selected from the group consisting of: a rhenium sputtering target, a rhodium sputtering target, an iridium sputtering target, a tungsten sputtering target, a molybdenum sputtering target, a tantalum sputtering target, a niobium sputtering target, and any combinations thereof, and the second sputtering target is a ruthenium sputtering target.

11. A synthetic antiferromagnetic laminated structure, comprising: a first ferromagnetic layer, the non-ferromagnetic spacing composite layer as claimed in claim 1, and a second ferromagnetic layer, wherein the first spacing layer of the non-ferromagnetic spacing composite layer is disposed between the first ferromagnetic layer and the second spacing layer of the non-ferromagnetic spacing composite layer, and the third spacing layer of the non-ferromagnetic spacing composite layer is disposed between the second spacing layer of the non-ferromagnetic spacing composite layer and the second ferromagnetic layer.

12. The synthetic antiferromagnetic laminated structure as claimed in claim 11, wherein the thickness of the second spacing layer of the non-ferromagnetic spacing composite layer is more than or equal to 0.18 nm and less than or equal to 0.65 nm.

13. The synthetic antiferromagnetic laminated structure as claimed in claim 11, wherein the first ferromagnetic layer and the second ferromagnetic layer are each independently selected from the group consisting of: a cobalt layer, a nickel layer, an iron layer, a cobalt-iron layer, a cobalt-platinum layer, a cobalt-palladium layer, a cobalt-nickel layer, an iron-platinum layer, an iron-palladium layer, an iron-boron layer, a cobalt-iron-boron layer, and any combinations thereof.

14. The synthetic antiferromagnetic laminated structure as claimed in claim 11, wherein a thickness of the first ferromagnetic layer is more than 0 nm and less than 5.0 nm, and a thickness of the second ferromagnetic layer is more than 0 nm and less than 5.0 nm.

15. The synthetic antiferromagnetic laminated structure as claimed in claim 11, wherein a thickness of the first ferromagnetic layer is more than or equal to 0.3 nm and less than or equal 2.0 nm, and a thickness of the second ferromagnetic layer is more than or equal to 0.3 nm and less than or equal 2.0 nm.

16. A magnetoresistive random access memory, comprising a bottom electrode, a pinning layer, a reference layer, a tunneling barrier layer, a free layer, and a top electrode from bottom to top, the pinning layer comprising the synthetic antiferromagnetic laminated structure as claimed in claim 11.

17. The magnetoresistive random access memory as claimed in claim 16, wherein the thickness of the second spacing layer of the non-ferromagnetic spacing composite layer of the synthetic antiferromagnetic laminated structure is more than or equal to 0.18 nm and less than or equal to 0.65 nm.

18. The magnetoresistive random access memory as claimed in claim 16, wherein the reference layer and the free layer each independently comprise a material selected from the group consisting of: cobalt, nickel, iron, cobalt-iron, cobalt-platinum, cobalt-palladium, cobalt-nickel, iron-platinum, iron-palladium, iron-boron, cobalt-iron-boron, and any combinations thereof.

19. The magnetoresistive random access memory as claimed in claim 16, wherein the tunneling barrier layer comprises a material selected from the group consisting of: magnesium oxide, ruthenium oxide, tantalum oxide, aluminium(III) trioxide, gallium(III) trioxide, and any combinations thereof.

20. The magnetoresistive random access memory as claimed in claim 16, wherein the top electrode and the bottom electrode each independently comprise a material selected from the group consisting of: tantalum, ruthenium, tantalum mononitride, titanium mononitride, and any combinations thereof.

* * * * *